United States Patent
Schmidt

[11] Patent Number: 6,104,590
[45] Date of Patent: Aug. 15, 2000

[54] ELECTRICAL APPARATUS, IN PARTICULAR A SURGE ARRESTER, HAVING AN APPARATUS FOR INDICATING A FAULT CURRENT

[75] Inventor: Walter Schmidt, Bellikon, Switzerland

[73] Assignee: Asae Brown Boveri AG, Switzerland

[21] Appl. No.: 09/187,344

[22] Filed: Nov. 6, 1998

[30] Foreign Application Priority Data

Nov. 8, 1997 [DE] Germany ............ 197 49 523

[51] Int. Cl.[7] .................................. H02H 3/22
[52] U.S. Cl. ............... 361/118; 361/93.6; 340/653; 340/664
[58] Field of Search .............. 361/87, 93.6, 117–118, 361/124–127, 131–132, 111; 340/647, 649, 653, 660, 664

[56] References Cited

U.S. PATENT DOCUMENTS

| | | | |
|---|---|---|---|
| 5,237,482 | 8/1993 | Osterhout et al. | 361/117 |
| 5,325,087 | 6/1994 | Mikli | 340/635 |
| 5,341,271 | 8/1994 | Hutchinson | 361/123 |

FOREIGN PATENT DOCUMENTS

0564334A1  10/1993  European Pat. Off. .

*Primary Examiner*—Michael J. Sherry
*Attorney, Agent, or Firm*—Burns, Doane, Swecker & Mathis, L.L.P.

[57] ABSTRACT

The electrical apparatus, which is preferably designed as a surge arrester (3), has an apparatus, which contains a current sensor, for indicating a fault state caused by a fault current (I). The indicating apparatus furthermore contains a receiver (read station 9), which can be operated from ground potential, for electromagnetic waves as well as an information carrier (8) which interacts with the current sensor and emits electromagnetic waves to the receiver (9). In such an apparatus, the fault state can be identified independently of optical signals.

8 Claims, 2 Drawing Sheets

ELECTRICAL APPARATUS, IN PARTICULAR A SURGE ARRESTER, HAVING AN APPARATUS FOR INDICATING A FAULT CURRENT

BACKGROUND OF THE INVENTION

1. Field of the Invention

The invention is based on an electrical apparatus, in particular a surge arrester.

2. Discussion of Background

The invention refers to a prior art of electrical apparatuses as is specified in EP 0 564 334 A1. An electrical apparatus which is described in this prior art is preferably designed as a surge arrester or as an insulator for high-voltage or medium-voltage grid systems contains a detection and indicating apparatus which is used to monitor the electrical apparatus for a fault current. This apparatus has a dielectric housing with an easily frangible window. An electrical connection of the electrical apparatus is passed through the dielectric housing. The part of the electrical connection which is located in the housing interior is surrounded by a magnet core which is fitted with the secondary winding of a current transformer which has the electrical connection as its primary winding. The secondary winding is connected to a non-reactive resistor which is embedded in an explosive charge that is arranged in the housing interior. When a fault current occurs, the non-reactive resistor which is continuously fed with current from the current transformer is heated very severely. The resistor detonates the explosive charge above a critical limiting temperature. In the process, the window of the dielectric housing is broken open and a colored strip, which is used as an indicating element, is ejected from the housing. After tripping and after optical indication of the fault state, the electrical apparatus and the detection and indicating apparatus are removed and replaced.

In an article by R. Stierlin "Technologie-transfer führt zu cleveren SAW-Tags" [Technology transfer leads to clever SAW tags], Management Zeitschrift [Management Journal] 63 (1994) No. 11, Verlag Industrielle Organisation BWIETH—Zürichbergstrasse 18, CH-8028 Zurich, information carriers (tags) are described which are attached to a mobile object, for example a vehicle or a container. When such a tag comes within the detection range of a read station, this station identifies the information carried by the tag and thus identifies the mobile object. This tag in general draws energy from a battery or from electromagnetic waves, in particular microwaves, and transmits electromagnetic waves, containing the information, to the read unit. To this end, the tag has an antenna for transmission and, possibly, for reception of electromagnetic waves as well as a semiconductor-based component which is connected to the antenna via an electrical conductor and in which data relevant to the mobile object are stored. The component may be designed as a so-called SAW tag (SAW=surface acoustic wave). It then receives microwave signals transmitted from the read unit and received via the antenna, converts these signals into acoustic signals, and thus allows analog signal processing in a minimum space. In addition, such a SAW tag does not need any internal energy source, such as a battery, but draws its energy from the power transmitted from the read unit.

SUMMARY OF THE INVENTION

Accordingly, one object of the invention is to provide a novel electrical apparatus of the type mentioned initially which, while having a simple design, is primarily distinguished by the fact that the fault state of the electrical apparatus can be identified quickly and easily even in poor lighting conditions.

In the case of the electrical apparatus according to the invention, a fault operating state caused by a fault current is indicated by means of an information carrier, acting as a current sensor, independently of an optical signal transmitter.

The information carrier, which is modified after the influence of the fault current, and thus the faulty electrical apparatus provided with the information carrier, as well, can thus be identified by the maintenance personnel even in darkness or in fog and at distances of up to 100 m with high reliability and in a short time.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 1:
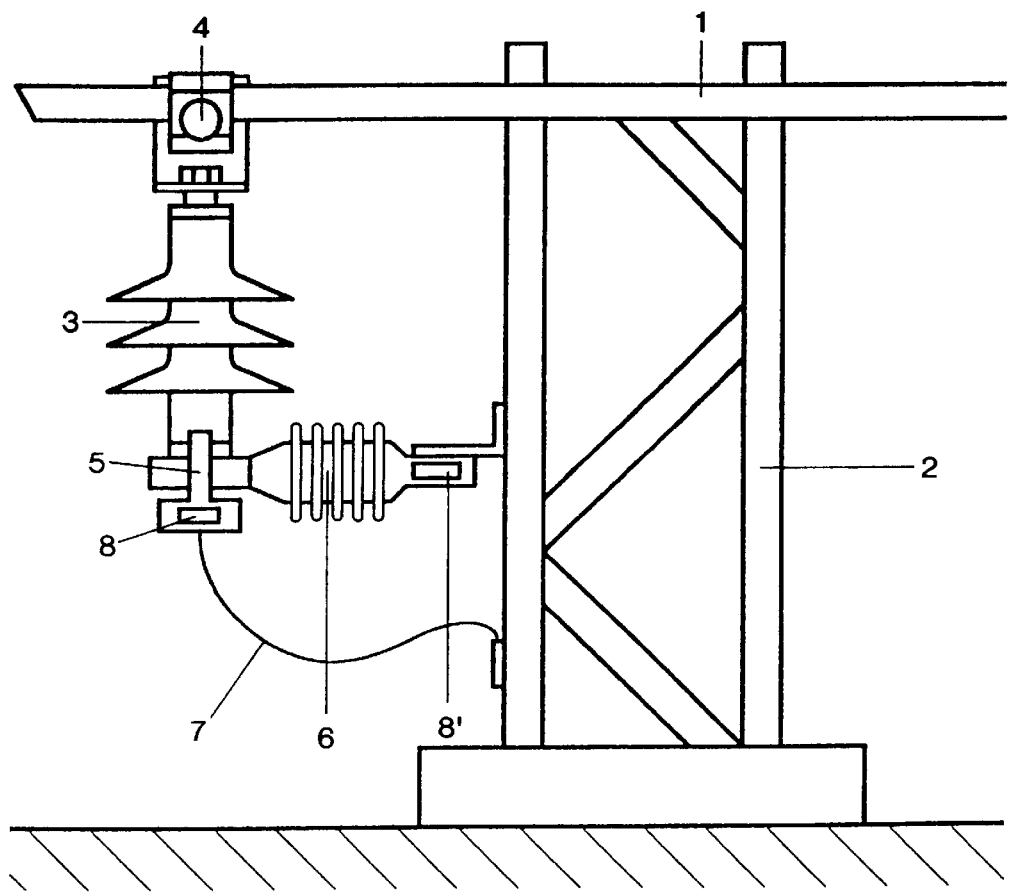
FIG. 1 shows a phase conductor of a high-voltage line, which conductor is electrically conductively connected to an electrical apparatus according to the invention which is designed as a surge arrester and contains an apparatus for indicating fault currents.
Figure 2:
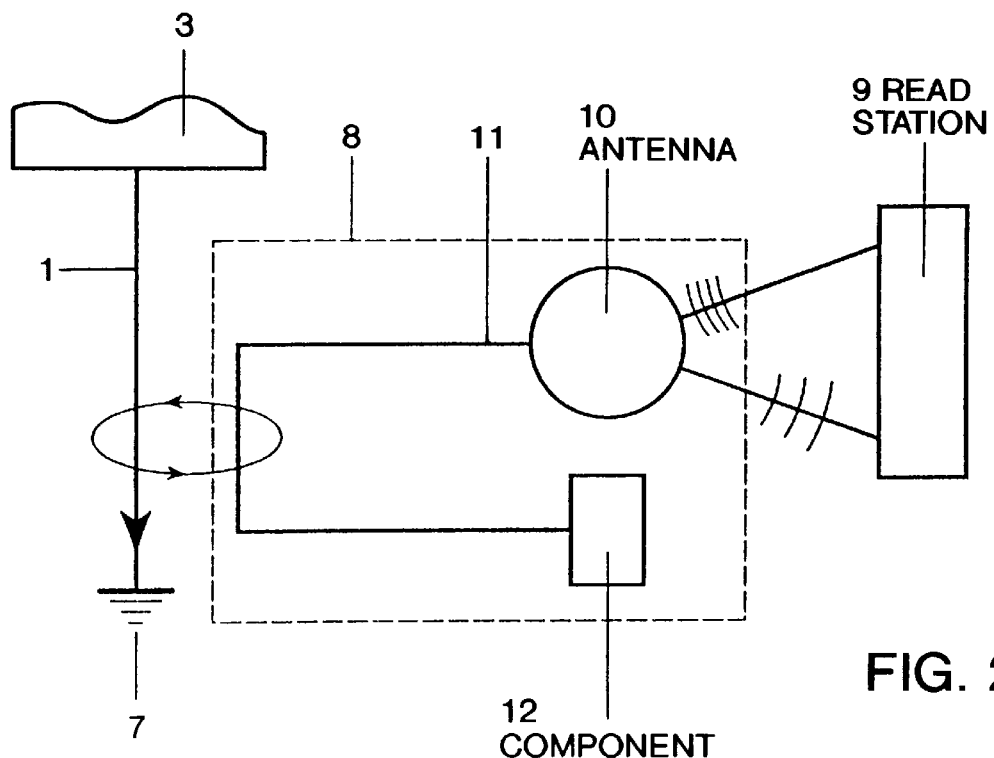
FIG. 2 shows a block diagram of a first embodiment of the indicating apparatus of the surge arrester according to FIG. 1.
Figure 3:
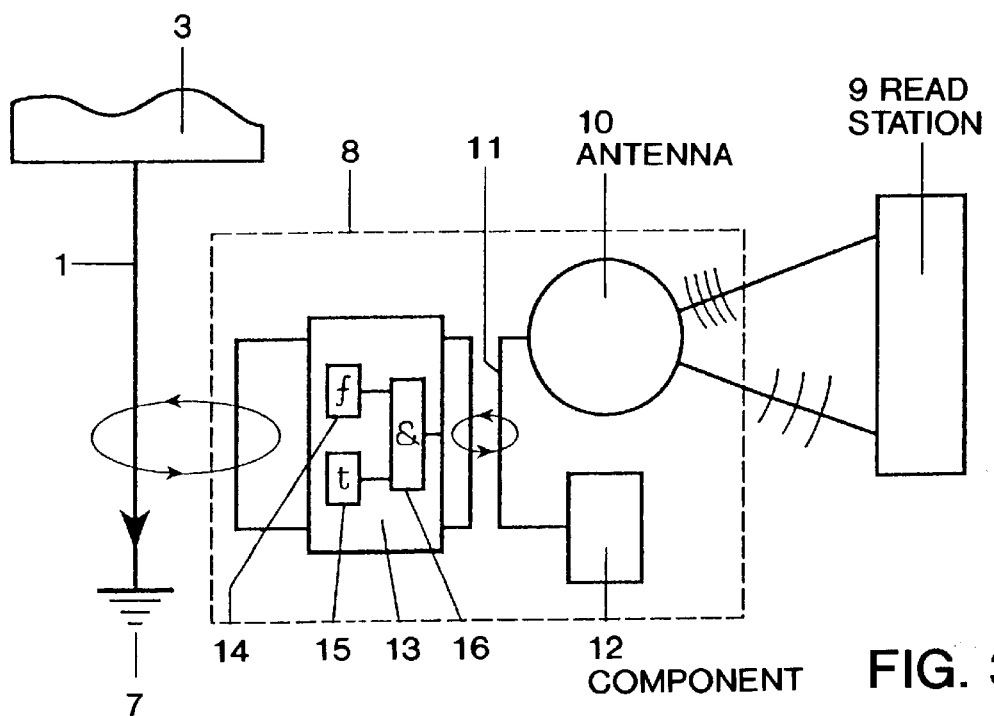
FIG. 3 shows a block diagram of a second embodiment of the indicating apparatus of the surge arrester according to FIG. 1.

Referring now to the drawings, wherein like reference numerals designate identical or corresponding parts throughout the FIGS. 1 to 3, the designation 1 denotes a phase conductor of a high-voltage line which is held in an electrically insulated manner on a grounded pylon 2. A surge arrester 3 is suspended on the phase conductor 1. The surge arrester 3 is conductively connected by an electrical connection 4 to the phase conductor 1 and is attached to the pylon 2 with the aid of a supporting insulator 6. A second electrical connection 5 of the surge arrester 3 is conductively connected to the pylon 2 via a ground cable 7.

An information carrier 8 of an apparatus for indicating the fault current is attached to the electrical connection 5 or to another part of the surge arrester 3 which may be subjected in operation to an undesirably high fault current or at least to the inductive effect of the fault current. The information carrier 8 may be arranged by means of any desired connection, for example by plugging, bonding or screwing, on the electrical connection 5 or any other part of the surge arrester which carries current in the event of a fault, for example the electrical connection 4.

A first implementation apparatus of the indicating apparatus illustrated schematically in FIG. 2 also contains, in addition to the information carrier 8, a receiver which is designed as a mobile read station 9 for signals based on electromagnetic waves. The read station 9 is taken to the faulty line section by the maintenance personnel for the high-voltage line for fault tracing and is used there to locate the faulty electrical apparatus.

The signals received by the read station 9 are formed in the information carrier 8. The energy required for this purpose can be taken from an electrical source in the information carrier 8 that is designed, for example, as a battery, or alternatively the energy can be fed into the information carrier 8 via electromagnetic waves which are advantageously formed in the read station 9. The information carrier 8 has an antenna 10 for emitting the electromagnetic waves, as well as a component 12 which feeds information signals to the antenna via an electrical conductor 11.

The component 12 is advantageously designed as an SAW tag. Microwaves radiated by the read station 9 are then injected from the antenna 10 into the information carrier 8 and interact via the electrical conductor 11 with the component 12 that is designed as a SAW tag. In this case, they receive information stored in the component 12 and are finally emitted by the information carrier 8 as information-carrying signals via the antenna 10, in the form of microwaves, and are received by the read station 9. There is thus no need for any energy source, normally designed as a battery, for the information carrier 8.

The electrical conductor 11, which is advantageously designed in strip form and is preferably fitted on a printed circuit board, is part of a current sensor which detects the fault current I. The electrical conductor 11 may make conductive contact with the part of the surge arrester carrying current in the event of a fault, but can also be arranged such that it is electrically insulated from the part which possibly carries current. The primary important factor is that, when a fault current I flowing through the surge arrester 3 occurs, at least a portion of the current I is carried in the electrical conductor 3, or the fault current I induces in the electrical conductor 11 a current which causes a change in the information carrier 8 by destruction of the electrical conductor 11 or of another part of the information carrier 8, or by influencing the data transfer in the information carrier 8. The read station 9 then receives a signal which identifies the change to state of the information carrier 8 and thus identifies the faulty arrester independently of the optical conditions. The defective surge arrester can then be removed and replaced by a new arrester with a new information carrier.

Instead of being mounted on a surge arrester, the information carrier can also be mounted on another electrical apparatus, for example an insulator of a switch or of a transformer, or on an insulator of a high-voltage system, for example the supporting insulator 6 (information carrier 8' according to FIG. 1). The read station 9 which interacts with the information carrier 8 or 8' can in any case use the pulse response received by it to identify whether the electrical apparatus being polled by it is serviceable or faulty.

Since certain electrical apparatuses, in particular such as the surge arrester 3, are designed such that they continuously carry a leakage current of predetermined magnitude or, briefly, a high surge current in operation, it is recommended that the fault current I not be coupled directly into the electrical conductor 11 of the information carrier 8 but, as is illustrated in the embodiment according to FIG. 3, via a descriminator 13 provided in the current sensor. The discriminator 13 then has a threshold-value detector 14 for the current amplitude and a time integrator 15, which detects the duration of the current, as well as an AND gate 16, which detects the output signals from the threshold-value detector 14 and the time integrator 15, and links them to one another. A signal which is proportional to the fault current is then not coupled from the discriminator 13 into the information carrier 8 until both the current amplitude and the time during which the current is flowing have respectively exceeded a limit value governed by the operating data of the arrester.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. An electrical apparatus, in particular a surge arrester, having an apparatus, which contains a current sensor, for indicating a fault state caused by a fault current, wherein the indicating apparatus has a receiver, which is at ground potential, for electromagnetic waves, as well as an information carrier which interacts with the current sensor and emits electromagnetic waves to the receiver.

2. The electrical apparatus as claimed in claim 1, wherein the information carrier is designed as a tag and has an antenna which interacts with the receiver, as well as a component which is fed from the antenna and feeds to the antenna.

3. The electrical apparatus as claimed in claim 2, wherein the component is designed as a SAW tag.

4. The electrical apparatus as claimed in claim 2, wherein the component is connected to the antenna via an electrical conductor which is part of the current sensor.

5. The electrical apparatus as claimed in claim 3, wherein the electrical conductor is subjected to the inductive effect of the fault current or carries at least a portion of the fault current.

6. The electrical apparatus as claimed in claim 3, wherein the current sensor contains a discriminator which acts on the electrical conductor.

7. The electrical apparatus as claimed in claim 6, wherein the discriminator contains a threshold-value detector for the current amplitude, a time integrator as well as an AND gate which links the output signals of the threshold-value detector and the time integrator.

8. The electrical apparatus as claimed in claim 1, wherein the information carrier is mounted on an externally accessible part of the electrical apparatus.

* * * * *